United States Patent
Ni

(10) Patent No.: US 9,768,742 B2
(45) Date of Patent: Sep. 19, 2017

(54) STRUCTURE OF AN ACTIVE CMOS PIXEL

(71) Applicant: NEW IMAGING TECHNOLOGIES, Verrieres-le-Buisson (FR)

(72) Inventor: Yang Ni, Palaiseau (FR)

(73) Assignee: NEW IMAGING TECHNOLOGIES, Evry (FR)

(*) Notice: Subject to any disclaimer, the term of this patent is extended or adjusted under 35 U.S.C. 154(b) by 52 days.

(21) Appl. No.: 14/675,470

(22) Filed: Mar. 31, 2015

(65) Prior Publication Data

US 2015/0207470 A1 Jul. 23, 2015

Related U.S. Application Data

(63) Continuation of application No. 12/674,393, filed as application No. PCT/EP2008/061261 on Aug. 27, 2008, now abandoned.

(30) Foreign Application Priority Data

Aug. 28, 2007 (FR) ...................... 07 57225

(51) Int. Cl.
| | |
|---|---|
| H04N 5/335 | (2011.01) |
| H03F 3/08 | (2006.01) |
| H04N 3/14 | (2006.01) |
| H04N 5/355 | (2011.01) |

(52) U.S. Cl.
CPC ............. *H03F 3/082* (2013.01); *H04N 3/155* (2013.01); *H04N 5/35509* (2013.01)

(58) Field of Classification Search
None
See application file for complete search history.

(56) References Cited

U.S. PATENT DOCUMENTS

| | | |
|---|---|---|
| 4,630,238 A | 12/1986 | Arakawa |
| 4,875,098 A | 10/1989 | Yamamoto et al. |
| 5,939,742 A | 8/1999 | Yiannoulos |
| 6,111,288 A | 8/2000 | Watanabe et al. |
| 6,159,849 A | 12/2000 | Kang et al. |
| 6,201,270 B1 | 3/2001 | Chen |
| 6,242,728 B1 | 6/2001 | Merrill et al. |
| 6,509,765 B1 | 1/2003 | Drost |
| 6,784,934 B1 | 8/2004 | Watanabe |
| 6,864,916 B1 | 3/2005 | Nayar et al. |
| 6,888,573 B2 | 5/2005 | Herold |
| 2002/0163584 A1 | 11/2002 | Kokubun et al. |
| 2003/0146993 A1 | 8/2003 | Kokubun et al. |
| 2004/0085466 A1 | 5/2004 | Herold |
| 2005/0162530 A1 | 7/2005 | Matsu |
| 2006/0119723 A1 | 6/2006 | Hagihara |
| 2006/0132633 A1 | 6/2006 | Nam et al. |
| 2006/0208979 A1 | 9/2006 | Fish et al. |
| 2007/0126516 A1 | 6/2007 | Ahmed et al. |
| 2007/0145239 A1 | 6/2007 | Mheen et al. |
| 2007/0194310 A1 | 8/2007 | Demars |
| 2008/0205133 A1 | 8/2008 | Gonzalez et al. |
| 2009/0001451 A1 | 1/2009 | Lee et al. |
| 2009/0002076 A1 | 1/2009 | Hayashi et al. |

FOREIGN PATENT DOCUMENTS

WO    WO-02/059974 A1    8/2002

*Primary Examiner* — Stephen Coleman
(74) *Attorney, Agent, or Firm* — Blakely Sokoloff Taylor & Zafman LLP

(57) ABSTRACT

The invention relates to a structure of an active pixel of the CMOS type (1) that comprises: at least one photodiode (10), characterized in that it comprises means for reading any bias voltage in the evolution phase of the photodiode (10) upon exposure.

17 Claims, 5 Drawing Sheets

STRUCTURE OF AN ACTIVE CMOS PIXEL

Figure 1A:
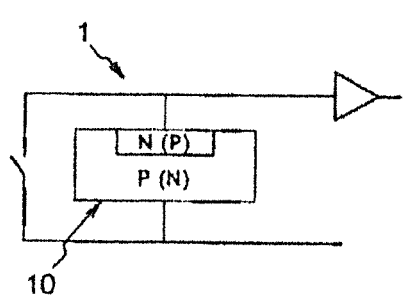

The invention relates to CMOS (Complementary Metal Oxide Semiconductor) integration technology which applies a family of electronic components with low electric consumption.

The invention in particular relates to CMOS pixels.

With CMOS integration technology it is possible to make chips for monolithic cameras with good resolution and a reasonable image quality. These monolithic cameras are mainly intended for mobile devices such as mobile telephones, personal digital assistants (PDAs), or portable computers. The images taken by these cameras are essentially used for viewing on a screen or on Internet.

The very economical aspect of this type of camera gives rise to an always increasing interest for applications relating to artificial viewing modes, such as the smart car airbag, side and longitudinal inspection of a car on the motorway, video monitoring of sensitive areas etc. . . . . . It is easily conceivable that for this type of applications, the taking of shots is generally accomplished under not very ideal illumination conditions, widely exceeding the dynamic range given to this kind of low cost CMOS sensors, thereby preventing them from providing an acceptable response in terms of functional dynamics.

One of the major difficulties during the use of JO such a camera lies in the extent of the variation of the illumination level for a same scene. This variation may easily exceed 120 dB between strongly illuminated areas and poorly illuminated areas. A conventional CCD/CMOS camera having a linear response may adapt to this with difficulty, and generally produces totally or partly saturated images, causing loss of relevant information and leading to an unstable viewing system.

A second difficulty lies in the extent and rate of variation of the light in a dynamic scene. The automatic exposure control system produced by a conventional camera cannot suitably respond to this and therefore produces total or partial saturations.

These saturation phenomena are extremely detrimental to proper operation of a viewing system.

Many methods propose a solution to this problem by generating active pixel structures having widened functional dynamics by means of a non-linear photoelectric response having a drop in sensitivity in the case of significant illumination.

Document EP1354360 describes an active pixel structure with a logarithmic response based on utilizing a photodiode in the photovoltaic regime.

In the field of standard CMOS technology, a photodiode is generally formed with a PN junction with N diffusion into a substrate of type P. In the photovoltaic operating mode, this photodiode generates a negative voltage in an open circuit, the absolute value of which is proportional to the logarithm of the illumination level of the photodiode. With a switch, it is possible to generate a short circuit in this photodiode in order to simulate the darkness condition in the presence of normal illumination. By reading the difference between the voltage generated by the photodiode in an open circuit and that in a short circuit, it is possible to suppress the additive offset noises in the read-out chain and to thereby obtain a clean image.

Prototype circuits implementing the structure of the pixel described in document EP1354360 have provided very high functional dynamics and satisfactory image quality. Nevertheless, this pixel structure still suffers from a certain number of deficiencies.

Indeed, first of all, it lacks physical compactness, this lack being the result of the simultaneous mandatory presence of NMOS and PMOS transistors within a same pixel, which requires an insulation case causing the loss of a large portion of useful surface area. Now, this loss of surface area increases the size of the pixel, reduces the size of the photodiode and therefore also reduces the photoelectric performance.

Next, within this structure, the photodiode only operates in the photovoltaic mode. Now, because of strong logarithmic compression, this operating mode generates an output signal of very low amplitude, thereby limiting the signal-to-noise ratio which may be obtained in the case of diurnal illumination.

Finally, the short-circuit switching transistor has some residual conductivity during its disabling. This phenomenon becomes critical in a creation of submicron CMOS technology.

Further, if document EP1354360 describes an active pixel structure utilizing the logarithmic area, this is not the same for the majority of the existing active pixels, which on the contrary utilize the linear area of the variation of the voltage on a photodiode after its reset. The reason for this is that the operation of a photodiode in the mixed or logarithmic portion is supposed to pose photoelectric problems within an array, therefore, a photodiode is generally prevented from entering these areas.

Now, complete utilization of the variation range generates a signal of strong amplitude by means of the linear area and extended functional dynamics by means of the mixed and logarithmic areas. Indeed, in the linear area, the relative noise of the image signal is strongly reduced so that the obtained image is of good quality; however, the dynamic range remains small. The mixed and logarithmic areas on the contrary strongly compress the amplitude of the image signal so as to almost eliminate completely the saturation of said signal, but the low amplitude and the negative polarity of the image signal make it difficult to read. It would therefore be interesting to combine the three areas so as to obtain at the same time good image quality and extended dynamic range.

An object of the invention is to provide at least one pixel structure with very high functional dynamics, which not only has a large physical compactness but also allows significant improvement of the signal-to-noise ratio.

For this purpose, according to the invention, an active pixel structure of the CMOS type is provided, comprising at least one photodiode, characterized in that it includes means for reading out a voltage of any polarity in the time-dependent variation phase of the photodiode during exposure. This gives said pixel structure high functional dynamics allowing an acknowledged improvement of the signal-to-noise ratio.

Advantageously but optionally, the structure includes at least one of the following features:
  the means for reading out a voltage of any polarity comprise a read-out transistor,
  the structure includes a buffer amplifier including the read-out transistor and a charging transistor,
  the read-out transistor has a negative threshold voltage,
  the charging transistor is located inside the structure of the pixel,
  the charging transistor is located outside the structure of the pixel,
  a threshold voltage of the read-out transistor is less than a voltage, the most negative voltage crossing the photodiode, the structure includes a means with which an output signal from the buffer amplifier may be sent onto a communications bus, the means for sending the output signal from the buffer amplifier onto a communications bus is a fourth transistor connected on a selection signal, the structure further includes a capacitive coupling capacitor mounted in series between the photodiode and the buffer amplifier, the structure includes means for setting up a voltage on the coupling capacitor within the pixel, the setting-up means are a resistor mounted between the buffer amplifier and a positive voltage source, the resistor consists of an NMOS transistor connected as a diode, the drain and the gate of said NMOS transistor are connected to two different power supply sources, the setting-up means are injection of a positive charge under ultraviolet radiation into the plate of the coupling capacitor connected to the buffer amplifier, the setting-up means are injection of a positive charge via the tunnel effect into the plate of the coupling capacitor connected to the buffer amplifier, the photodiode is used as one of the plates of the coupling capacitor, the structure includes an reset transistor capable of being disabled by application of a negative voltage, and the aforementioned transistors are of the same type, either NMOS or PMOS, and the read-out transistor is of the depleted NMOS type.

According to the invention, a method for operating a pixel according to the invention is also provided, characterized by the fact that it comprises the steps consisting of: resetting a photodiode, before taking shots, to an initial voltage V by means of a zero-resetting signal (RAZ) which enables the reset transistor; disabling the reset transistor and letting the photodiode vary under an illumination, during the exposure; performing a first read-out at the end of the exposure by means of a selection signal SEL; and performing a second read-out during or suddenly after re-enabling of the reset transistor.

Advantageously, but optionally, the method for operating a pixel utilizes the following areas of the variation of the voltage on the photodiode after its reset:

the linear area, the logarithmic area, the mixed area.

Figure 1B:
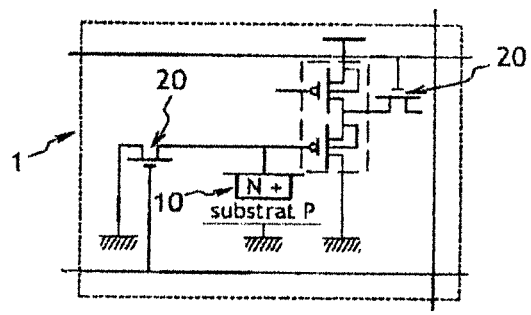
Figure 2:
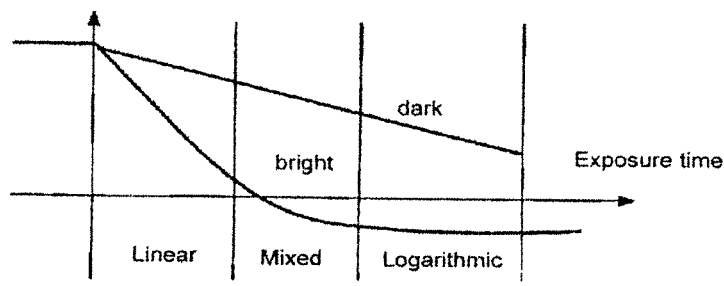
Figure 3A:
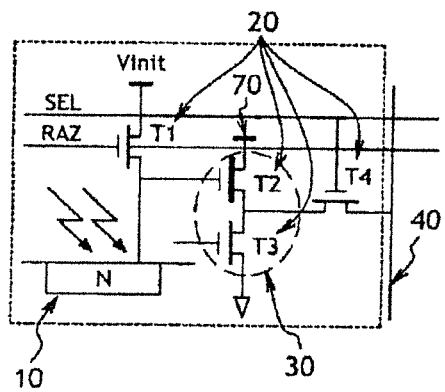
Figure 3B:
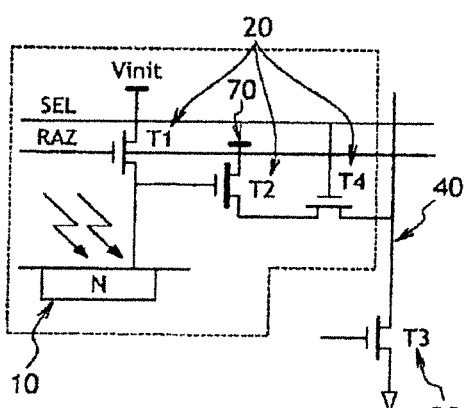
Figure 4A:
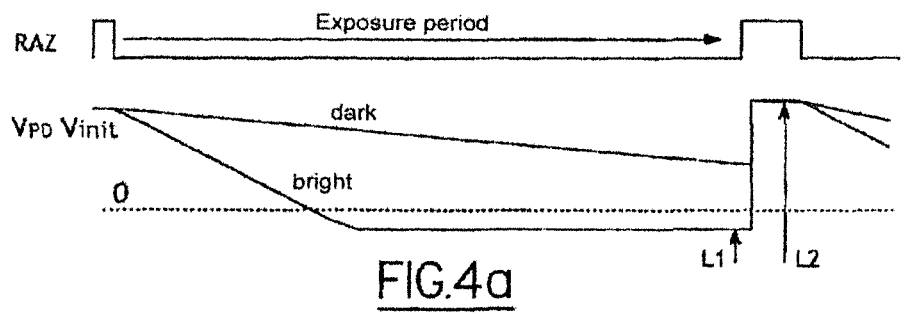
Figure 4B:
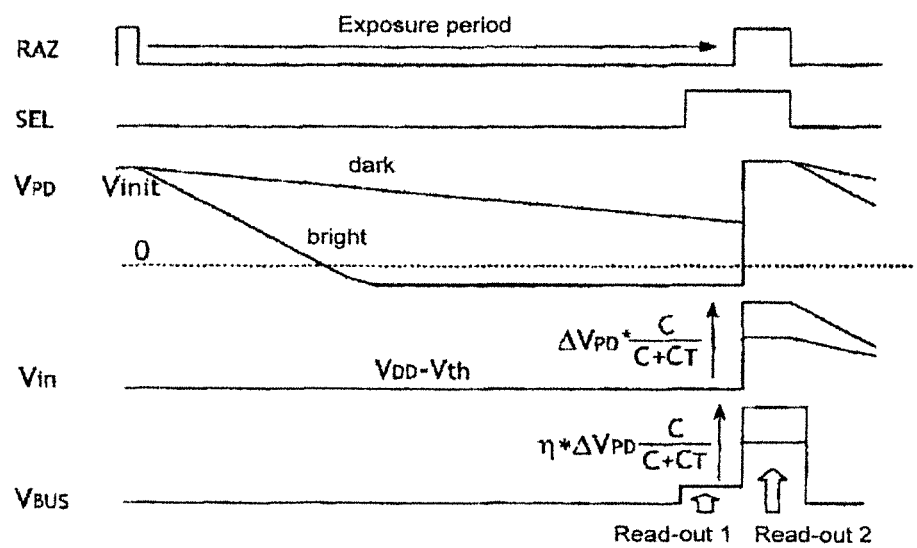
Figure 5:
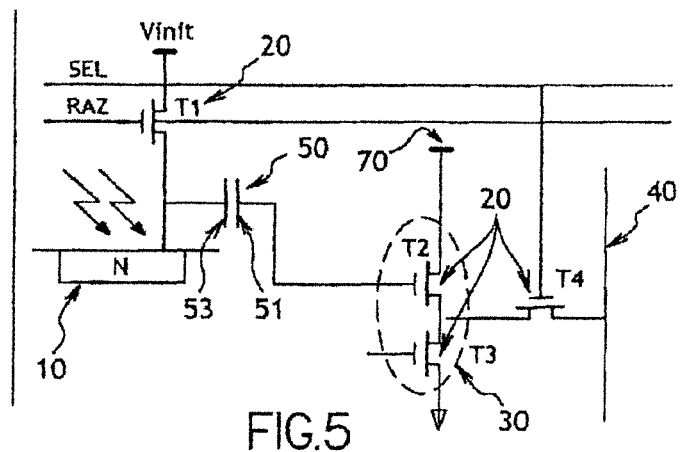
Figure 6A:
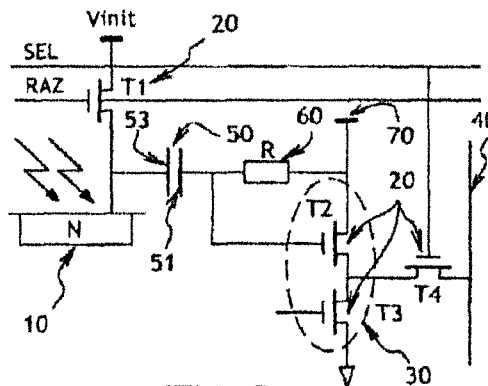
Figure 6B:
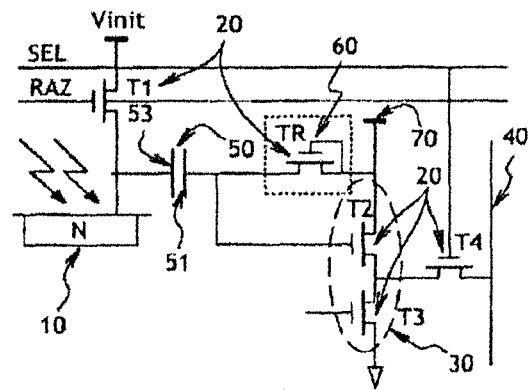
Figure 6C:
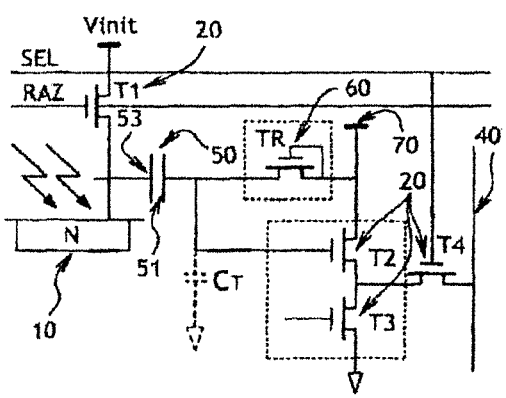
Figure 6D:
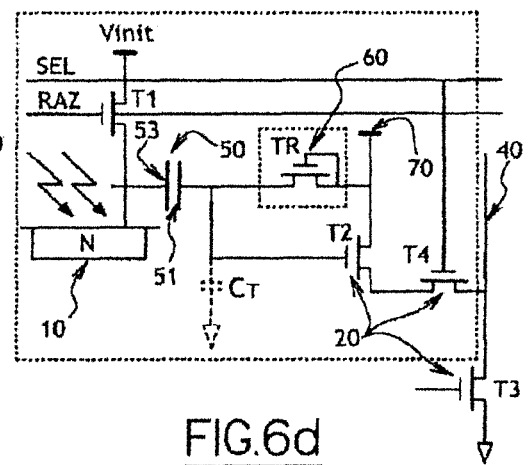
Figure 6E:
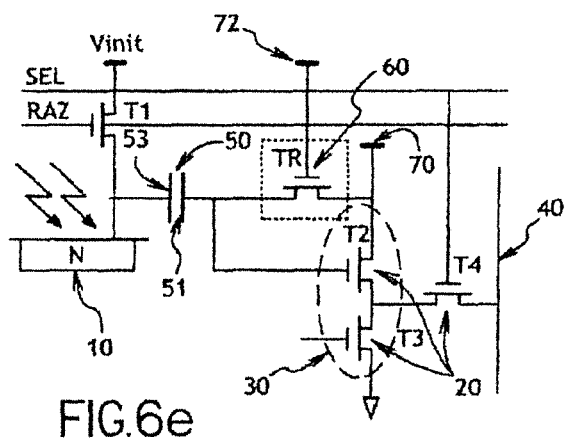
Figure 7A:
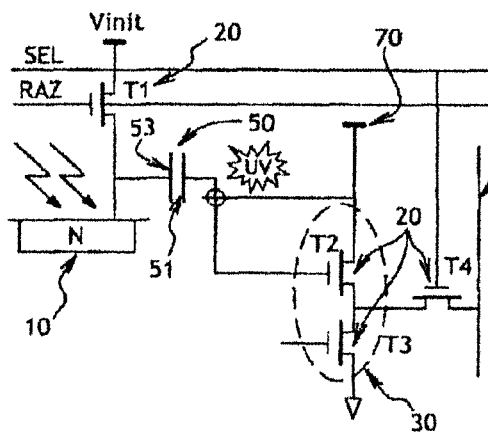
Figure 7B:
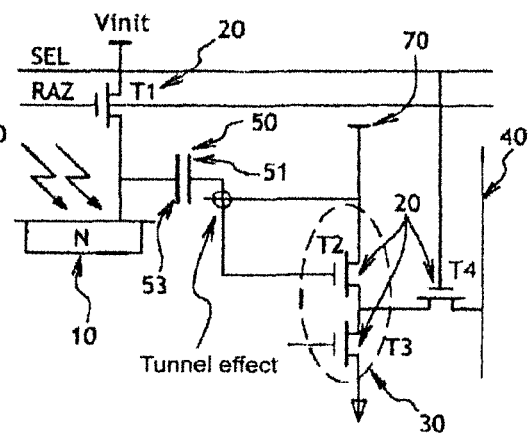
Figure 8A:
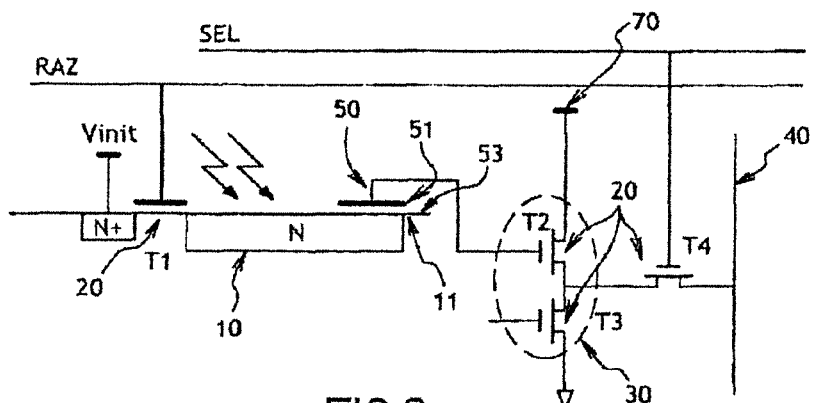
Figure 8B:
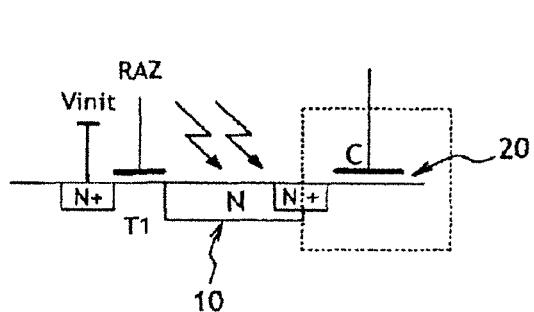
Figure 9:
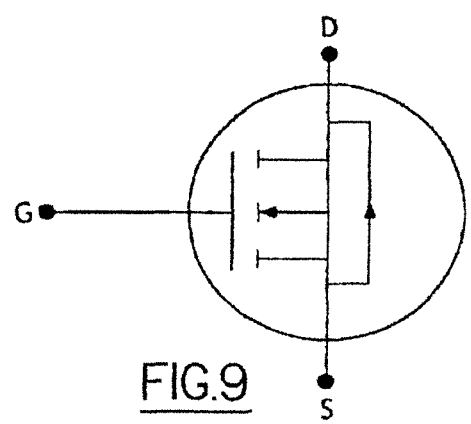
Figure 10:
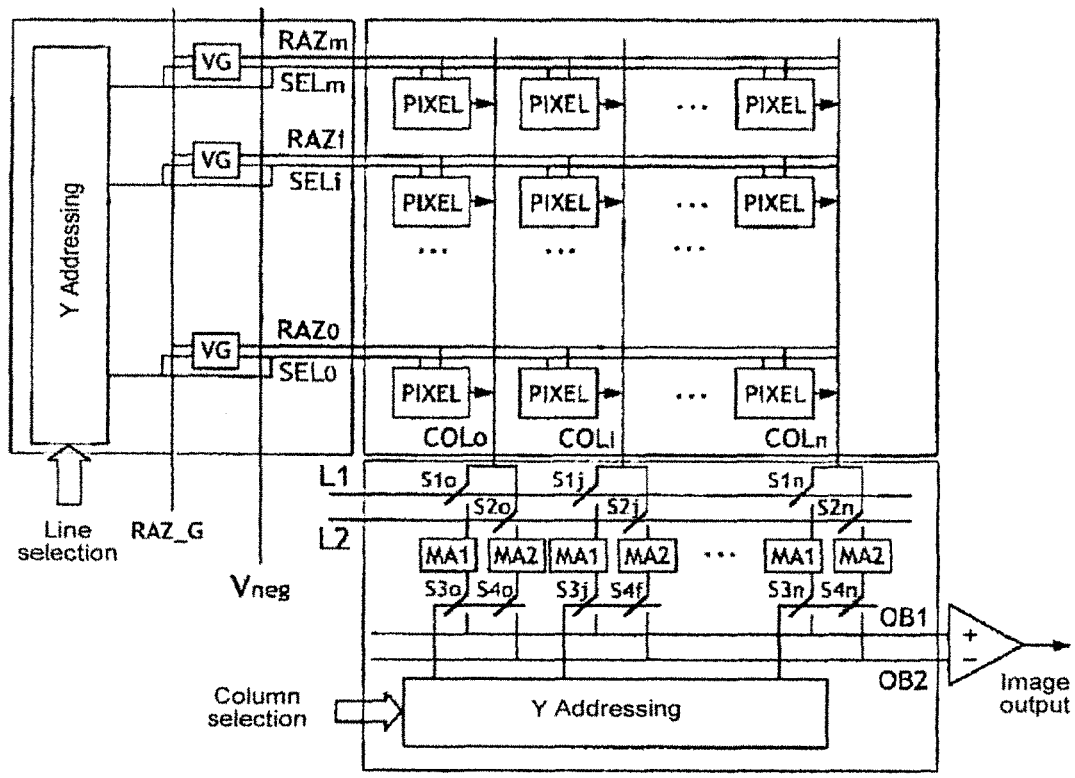

Other features, objects and advantages of the invention will further become apparent from the description which follows, which is purely illustrative and non-limiting, and should be read with reference to the appended drawings, wherein:

FIG. 1a is a view of a photoreceiver with a photodiode in a photovoltaic mode according to the prior art, FIG. 1b is a view of a structure of a pixel provided with a photoreceiver according to the prior art, FIG. 2 is a curve illustrating the variation of the voltage on a photodiode after its reset, FIGS. 3a and 3b are two views of a pixel structure according to a first embodiment of the invention, FIGS. 4a and 4b are two time diagrams showing the operation of a pixel according to the first and a second embodiment of the invention, respectively, FIG. 5 is a view of a pixel structure according to a second embodiment of the invention, FIGS. 6a, 6b, 6c, 6d and 6e are five views of a pixel structure according to five alternatives of the second embodiment of the invention, FIGS. 7a and 7b are two views of a pixel structure according to two other alternatives of the second embodiment of the invention, FIG. 8a is a view of a pixel structure according to another alternative of the second embodiment of the invention, FIG. 8b is a partial view of a pixel structure according to another alternative of the second embodiment of the invention, FIG. 9 is a view of a typical transistor, and FIG. 10 is a view of an array configuration of a pixel structure.

With reference to FIGS. 3a-4a, we shall now describe a first embodiment of the invention.

According to this first embodiment of the invention, a pixel structure 1 includes:

a photodiode 10 having a junction capacitance $C_{PD}$, made by N type diffusion into a substrate of type P, transistors 20, including at least one reset transistor T1 of the NMOS (N Metal Oxide Semiconductor) type, means for reading out a voltage of any polarity in the photodiode 10 when the latter is illuminated.

The depleted N type transistor has a negative threshold voltage $T_S$—the threshold voltage $T_S$ being the voltage at one of the poles of the transistor called the "gate" G, the two other poles being the "source" S and the "drain" D—which allows it to be kept "conducting" when a voltage greater than $T_S$, and in particular a negative voltage belonging to the interval $[T_S; 0]$, is applied between the gate G and the source S. When the photodiode 10 varies in a logarithmic area, a negative voltage likely to be present is relatively low: it does not exceed 0.7 V in absolute value. Therefore a threshold voltage $T_S$ of the order of −1 V allows the voltage of the photodiode 10 to be read out over the whole range of its variation over time and it may be translated into a purely positive voltage by means of such a depleted transistor, which may be utilized by conventional read-out circuits.

The photodiode 10 is used with reverse bias. Before taking shots, a generator, either external or internal to the pixel produces a reverse initial voltage $V_{init}$ powering the reset transistor T1, which sets up this initial reverse voltage $V_{init}$ in the photodiode 10. This operation is called "initializing or resetting to zero (RAZ) the photodiode".

In an alternative embodiment, the initial voltage $V_{init}$ is programmable. Thus, it allows determination of the range of use of the photodiode 10, which either starts in the linear area, or in the mixed area or in the logarithmic area (cf. FIG. 2), depending on the luminosity to which it is subject and on the conditions of its use which follows this reset.

Next, during a so-called exposure period $T_{exp}$, the transistor T1 is disabled, so that a photoelectric current $I_\lambda$ induced within the photodiode 10 then illuminated, gradually discharges the voltage into the photodiode 10. A variation between the initial voltage in the photodiode 10 and a voltage obtained at the end of the exposure forms the output signal of the pixel 1. The voltage curve of the photodiode 10 is visible in FIG. 2.

The time-dependent variation range of a photodiode is divided into two main areas, defined as follows.

If the light intensity is relatively low, at the end of the exposure period, the photodiode remains under reverse bias. That is to say that the voltage on the photodiode remains positive:

$$V_{PD} = V_{init} - \frac{I_\lambda * T_{exp}}{C_{PD}} > 0$$

wherein $C_{PD}$ is the junction capacitance of the photodiode and $T_{exp}$ is the exposure time. Therefore, it is stated in this case that the photodiode is operating in the linear area.

If the light on the contrary is very intense, the photodiode will be completely discharged and the voltage on the photodiode then becomes negative:

$$V_{PD} = -\frac{kT}{q}\ln\left(\frac{I_\lambda}{I_S} + 1\right) < 0$$

wherein k is the Boltzmann constant, q is the elementary charge, T is the absolute operating temperature of the photodiode and $I_S$ represents a reverse current also called the saturation current of the junction of the photodiode, observed when a diode is reverse-biased in the total absence of light. The voltage on the photodiode becomes proportional to the logarithm of the light intensity. It is stated in this case that the photodiode operates in the logarithmic area.

After the exposure, the voltage $V_{PD}$ of the photodiode 10 has therefore become either $$V_{PD} = V_{init} - \frac{I_\lambda * T_{exp}}{C_{PD}} > 0$$

if the photodiode 10 remains in the linear area, or $$V_{PD} = -\frac{kT}{q}\ln\left(\frac{I_\lambda}{I_S} + 1\right) < 0$$

if the photodiode enters the logarithmic area.

A MOS follower 30—also called a buffer amplifier—is connected between the reset transistor T1 and the photodiode 10. It includes means for reading out a voltage of any polarity in the photodiode 10. These read-out means comprise a read-out depleted NMOS transistor T2. The follower 30 also includes a transistor T3 having a charging function included in the pixel 1. Alternatively, the transistor T3 is positioned outside the pixel 1. The configuration which places the charge T3 in the pixel 1 is however more stable than the one which places it outside the pixel 1.

The read-out depleted NMOS transistor T2 is used here, over the whole range where it is conducting, in order to translate the electric level of the voltage read on the photodiode 10 so as to obtain a voltage forming an output signal, which may be utilized by the circuit using this output signal.

In order to transmit the output signal of the follower 30 on a communications bus 40, the follower 30 is selectively connected onto the bus 40 with a fourth transistor T4, called a selection transistor. The latter may be enabled by a selection signal SEL, arriving on the gate of the transistor T4. This selection mechanism allows access to a determined pixel in a pixel array. At the end of the exposure, a first read-out L1 is achieved by means of this SEL signal. This read-out gives the final voltage in the photodiode 10 plus an offset component $V_{offset}$ of the translation, provided by the voltage follower 30.

At the end of the exposure period, the reset transistor T1 is re-enabled. A second read-out L2 is then made during or immediately after the end of the re-enabling of the reset transistor T1. This read-out L2 gives the initial voltage in the photodiode 10 added to the offset component $V_{offset}$ of the voltage follower 30.

A subtraction between the values of both of these read-outs gives an image signal free of the offset of the voltage follower 30 within the pixel 1. FIG. 4a gives a time diagram of the operation of the pixel 1.

In the case of this embodiment, the pixel structure 1 only uses a single type of transistor 20. This suppresses the need for an insulation case, required upon the simultaneous presence of NMOS and PMOS transistors within a same pixel 1, and provides a significant gain in space within the pixel 1. By saving a useful surface area, it is possible not to reduce the photodiode 10 and therefore to gain in photoelectric performance.

Another object of the invention is to provide at least one pixel structure which may utilize the whole range of variation of a photodiode, which means the possibility of utilizing in addition to the linear area, the mixed and logarithmic portions for which the voltage on the photodiode becomes negative.

Now, a compact pixel using a single type of transistors can normally only read a positive voltage of the illuminated photodiode.

Another object of the invention is therefore to provide at least one pixel structure enabling by using a single type of transistor the utilization or all the variation areas of the photodiode.

With reference to FIGS. 4b-8b, we shall now describe a second embodiment of the invention.

According to this second particular embodiment of the invention, a pixel structure 1 includes:
 a photodiode 10 having a junction capacitor $C_{PD}$, made by N diffusion into a substrate of type P,
 transistors 20, including at least one reset transistor T1 of the NMOS type,
 means for reading a voltage of any polarity in the illuminated photodiode 10,
 a capacitive coupling capacitor 50.

This second pixel structure 1 proposes the utilization of the complete range of the variation of a photodiode 10 without using any depleted NMOS transistor for T2.

The operation of the pixel 1 is identical with that of the first structure: the photodiode 10 is reset to a reference voltage by enabling the transistor T1, and then when the transistor T1 is disabled, the photodiode 10 is discharged during the exposure period, at the end of which two read-outs of the voltage of the photodiode 10 are performed, one before the re-enabling of the transistor T1 and the other one after or during the re-enabling of the transistor T1. A subtraction between the values of these two read-outs gives a clean image signal since it is free of the offset of the voltage follower 30 within the pixel 1.

The difference relatively to the first pixel structure 1 lies in the fact that the cathode of the photodiode 10 is coupled, not with a read-out depleted NMOS transistor T2, but with a normal read-out NMOS type transistor T2 with a positive threshold voltage $T_S$, by means of a capacitive coupling capacitor 50. The voltage at the input of the read-out transistor T2 is thus the result of the sum between the voltage of the photodiode 10 and the voltage of the capacitor 50 mounted in series. It is possible, depending on the amount and on the polarity of the charges within the capacitor 50, to translate the voltage of the photodiode 10 into a range which may be handled by the read-out transistor T2. Setting up a suitable amount of charges within the capacitor 50 allows the read-out transistor T2 to read out the voltage of the photodiode 10 over the whole range of its variation, so that the thereby obtained voltage is always greater than the threshold voltage $T_S$ of the read-out NMOS transistor T2.

Different methods are proposed for setting up a suitable voltage on the coupling capacitor 50 within a pixel 1.

A first method illustrated in FIGS. 6a-6e consists of connecting the input (gate) of the read-out transistor T2 to a positive voltage with a value greater than the threshold voltage $T_S$ of the read-out transistor T2 through a resistor 60 consisting of an NMOS transistor TR and connected to a positive voltage source 70. The resistor 60 is of a determined value R such that a time constant RC, wherein C is the capacitance of the coupling capacitor 50, is, for example, ten times greater than the time interval existing between two read-outs L1, L2 at the end of the exposure. In this way, there is practically no loss of charge on the capacitor 50 between the two read-outs and the image signal is then reliably retransmitted to the input of the read-out transistor T2.

Alternatively, as illustrated in FIG. 6e, the transistor TR is powered at its gate by a voltage source 72 while its drain is connected to the voltage source 70. Both voltage sources 70 and 72 may be of the same voltage or of different voltages.

Within the scope of this first method, the first read-out measures the voltage at the output of the follower 30, this voltage being substantially equal to $V_{DD}-V_{th}$ wherein $V_{DD}$ is the power supply voltage 70 and $V_{th}$ is the threshold voltage of the transistor TR. The output of the follower 30 is expressed by: $(V_{DD}-V_{th})-V_{offset}$. The value of this read-out is subsequently stored in a memory, either an analog or digital memory, which may either be found on a chip including pixels or outside the latter.

The second read-out is accomplished in the same way as for the first embodiment of the invention: by enabling the RAZ signal. When the latter is enabled for the second time, the voltage on the photodiode 10 is again reset to $V_{init}$. This causes a change in voltage on the photodiode 10 which is either equal to $$\Delta V_{PD} = \frac{I_\lambda * T_{exp}}{C_{PD}}$$

if the photodiode 10 remains in the linear area or to $$\Delta V_{PD} = V_{init} + \frac{kT}{q}\ln\left(\frac{I_\lambda}{I_S}+1\right)$$

if the photodiode 10 enters the logarithmic area. This positive change in the voltage of the photodiode 10 also generates a positive change at the input of the follower 30 through the capacitor 50, which positive change momentarily blocks the transistor 60. The value of the change at the input of the voltage follower 30 is equal to $$\Delta V_{PD} * \frac{C}{C+C_t}$$

wherein $C_T$ represents the equivalent parasitic capacitance at the input of the follower 30 and C is the capacitance of the capacitor 50.

The voltage change at the output of the follower 30 after re-enabling of the reset transistor T1 may be written in the following way:

$$(V_{DD}-V_{th}) - V_{offset} + \eta * \Delta V_{PD}\frac{C}{C+C_t}$$

wherein η represents the gain of the follower 30. A read-out of this value is performed, but this value is subtracted from the value of the first read-out: $(V_{DD}-V_{th})-V_{offset}$. In this way, an image signal is obtained:

$$\eta * \Delta V_{PD}\frac{C}{C+C_t}$$

which is linear with the image signal on the photodiode 10; in other words, the variation between both signals is preserved.

Alternatively, the resistor 60 is made in thin layer(s) after forming the integrated transistors 20.

A second method illustrated in FIGS. 7a and 7b consists of using point-like conductivity within an electric insulator. This point-like conductivity may come from different physical phenomena:
1. ionizing radiation
2. a tunnel effect of cold electrons,
3. the effect of hot electrons.

It is possible in this case to add a charge injection device to the capacitor 50 which sets up in a controlled (implicit or explicit) way a suitable amount of charge within this capacitor 50. This charge injection may be accomplished in two ways:
1. an offset voltage set up on the coupling capacitor 50 by means of an injection of a positive charge under ultraviolet radiation into its plate 51 connected to the voltage follower 30 (FIG. 7a),
2. an overvoltage applied to the coupling capacitor 50 by means of an injection of a positive charge by a tunnel effect in its plate 51 connected to voltage follower 30 of the normal NMOS type (FIG. 7b).

As shown in FIG. 8a, it is possible to reduce the darkness current of the photodiode 10 by using its cathode 11 like one of the plates 51, 53 of the coupling capacitor 50. For this, the N diffusion of the source S of the transistor T1 is merged with the N diffusion of the photodiode 10. This physical arrangement suppresses the need of ohmic contact on the photodiode 10, so as to prevent the photodiode 10 from potential physical damages related to the making of the contacts, and reduce the reverse current $I_S$ which flows through it.

Alternatively, the capacitor 50 may be made with a transistor 20, for which the drain D or the source S or both coincide with the N diffusion of the photodiode 10 (see FIG. 8b).

In the case of both particular embodiments of the invention, the whole range of the variation of the photodiode 10 is utilized.

When the photodiode 10 varies in the logarithmic area, the negative voltage of the photodiode 10 may cause involuntary conduction of the reset transistor T1, causing fixed or variable noises on the acquired image and thereby strongly reducing the quality of the image. To overcome this flaw, a negative voltage is applied to the gate G of the transistor T1 during the exposure period. This negative voltage suppresses the parasitic conduction of transistor T1 so as to disable it. It may be provided by an external power supply source or by a generator internal to the CMOS sensor comprising the pixel 1.

An incorporation of the pixel of the invention in an array configuration of two dimensions with (m+1) lines and (n+1) columns is illustrated in FIG. 10. This figure illustrates in a non-exclusive way a particular embodiment compliant with the description of the pixel structure 1 of the invention, from which other designs may easily be inferred by one skilled in the art.

The operation of this configuration is the following: a line of pixels is selected by applying an address $Y_i$ to an addressing circuit Y. An output of pixels of the line $Y_i$ is connected onto a column read-out bus COL. The output of this line is sampled and stored in an analog memory MA1 by enabling the signal L1. A signal RAZ_G is then enabled, also causing the enabling for resetting to zero the pixels of the selected line $Y_i$. The output of this line is sampled in a second analog memory MA2 by the signal L2. Once this line access phase is completed, an address X is applied to an addressing circuit X. The contents of the analog memories MA1 and MA2 are directed towards a differential amplifier via the busses OB1 and OB2. This differential amplifier produces a difference which allows suppression of the offset errors in the read-out.

Of course the present invention is not limited to the particular embodiments which have just been described, but extends to all alternatives which comply with its spirit.

Alternatively, in a non-limiting and non-exclusive way, the transistors T1, T2, T3, T4 and TR are of the PMOS type.

The invention claimed is:

1. A structure of an active pixel of the CMOS type comprising:
    at least one photodiode,
    a reset transistor to set the photodiode at an initial voltage;
    means for reading a voltage with any polarity in the time-dependent variation phase of the photodiode during exposure, including a buffer amplifier including a read-out transistor and a charging transistor,
    wherein said structure further includes a capacitive coupling capacitor element having at least two plates forming terminals, said capacitive coupling capacitor element being electrically mounted in series between and the photodiode and an input of the readout transistor of the buffer amplifier, wherein one of said terminals of said capacitor element is directly connected to one terminal of said photodiode and another one of said terminals of said capacitor element is directly connected to said input of the read-out transistor, said capacitive coupling capacitor element translating the voltage of the photodiode for the read-out transistor to be able to read said voltage of the photodiode over its full range of variation.

2. The structure of an active pixel of the CMOS type according to claim 1, wherein the read-out transistor has negative threshold voltage.

3. The structure of an active pixel of the CMOS type according to claim 1, wherein the charging transistor is located inside the structure of the pixel.

4. The structure of an active pixel of the CMOS type according to claim 1, wherein the charging transistor is located outside the structure of the pixel.

5. The structure of an active pixel of the CMOS type according to claim 1 wherein a threshold voltage of the read-out transistor is less than a voltage, the most negative voltage, capable of passing through the photodiode.

6. The structure of an active pixel of the CMOS type according to claim 1, wherein said structure includes a reset transistor capable of being disabled by application of a negative voltage.

7. The structure of an active pixel of the CMOS type according to claim 1, wherein the transistors are of the same type, either NMOS or PMOS, and in that the read-out transistor is a depleted transistor.

8. A method for operating a pixel according to claim 1, comprising the steps of:
    1) resetting a photodiode, before taking shots, to an initial voltage V, with a signal RAZ enabling the reset transistor;
    2) disabling the reset transistor and letting the photodiode vary under illumination during the exposure;
    3) performing a first read-out at the end of the exposure with a selection signal SEL, and
    4) performing a second read-out during or suddenly after re-enabling the reset transistor.

9. The structure of an active pixel of the CMOS type according to claim 1, wherein said structure includes a means to send an output signal from the buffer amplifier onto a communications bus.

10. The structure of an active pixel of the CMOS type according to claim 9, wherein the means for sending the output signal of the buffer amplifier onto a communications bus is a transistor connected to a selection signal.

11. The structure of an active pixel of the CMOS type according to claim 1, wherein said structure includes means for setting up a voltage on the coupling capacitor element within the pixel.

12. The structure of an active pixel of the CMOS type according to claim 11, wherein the setting-up means are an injection of a positive charge under ultraviolet radiation into the plate of the coupling capacitor element connected to a buffer amplifier.

13. The structure of an active pixel of the CMOS type according to claim 11, wherein the setting-up means are an injection of a positive charge by the tunnel effect into the plate of the coupling capacitor element connected to the buffer amplifier.

14. The structure of an active pixel of the CMOS type according to claim 13, wherein the photodiode is used as one of the plates of the coupling capacitor element.

15. The structure of an active pixel of the CMOS type according to claim 11, wherein the setting-up means are resistors mounted between the buffer amplifier and a positive voltage source.

16. The structure of an active pixel of the CMOS type according to claim 15, wherein the resistor consists of an NMOS transistor connected as a diode.

17. The structure of an active pixel of the CMOS type according to claim 15, wherein the drain and the gate of the transistor are connected to two different power supply sources.

* * * * *